ис010852327В1

(12) United States Patent
Perticaroli et al.

(10) Patent No.: US 10,852,327 B1
(45) Date of Patent: Dec. 1, 2020

(54) DIGITALLY SELF-CALIBRATED ZERO-VOLTAGE SWITCHING (ZVS) DETECTION SYSTEM

(71) Applicant: Integrated Device Technology, Inc., San Jose, CA (US)

(72) Inventors: Stefano Perticaroli, Rome (IT); Danilo Ruscio, Latina (IT); Filippo Neri, Thalwil (IT)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/544,491

(22) Filed: Aug. 19, 2019

(51) Int. Cl.
| | |
|---|---|
| *G01R 19/175* | (2006.01) |
| *H02M 1/08* | (2006.01) |
| *G01R 19/25* | (2006.01) |
| *G01R 35/00* | (2006.01) |
| *H02J 50/10* | (2016.01) |

(52) U.S. Cl.
CPC ....... *G01R 19/175* (2013.01); *G01R 19/2503* (2013.01); *G01R 19/2506* (2013.01); *G01R 35/005* (2013.01); *H02M 1/083* (2013.01); *H02J 50/10* (2016.02)

(58) Field of Classification Search
CPC .......... H04N 5/378; H03M 1/56; H03F 3/245; G01R 19/175; G01R 19/2506; G01R 19/2503; G01R 35/005; H02M 1/083; H02J 50/10
See application file for complete search history.

(56) References Cited

U.S. PATENT DOCUMENTS

| | | | | |
|---|---|---|---|---|
| 2008/0238902 | A1* | 10/2008 | Huang ................... | G06F 1/3203 345/204 |
| 2014/0232890 | A1* | 8/2014 | Yoo ..................... | H04N 5/23245 348/220.1 |

* cited by examiner

*Primary Examiner* — Sibin Chen
(74) *Attorney, Agent, or Firm* — Haynes and Boone, LLP

(57) ABSTRACT

In some embodiments, a threshold calibration system to provide a zero voltage switching signal is presented. The system includes a divider coupled to a switching node; a calibration ramp generator; a reference voltage generator; a comparator; a first multiplexer coupled to receive a divider output signal from the divider and a calibration ramp signal from the calibration ramp generator and provide a signal to the comparator based on a calibration enable signal; a second multiplexer coupled to receive reference voltages from the reference voltage generator, the second multiplexer provided a threshold signal to the comparator; and a digital feedback circuit receiving an output signal from the comparator and providing the zero voltage switching signal.

7 Claims, 6 Drawing Sheets

DIGITALLY SELF-CALIBRATED ZERO-VOLTAGE SWITCHING (ZVS) DETECTION SYSTEM

TECHNICAL FIELD

Embodiments of the present invention are related to wireless power transmitters and, in particular, to a digitally self-calibrated zero-voltage switching (ZVS) detection system.

DISCUSSION OF RELATED ART

Mobile devices, for example smart phones, tablets, wearables and other devices are increasingly using wireless power charging systems. In general, wireless power transfer involves a transmitter driving a transmit coil and a receiver with a receiver coil placed proximate to the transmit coil. The receiver coil receives the wireless power generated by the transmit coil and uses that received power to drive a load, for example to provide power to a battery charger.

There are multiple different standards currently in use for the wireless transfer of power. The more common standards for wireless transmission of power include the Alliance for Wireless Power (A4WP) standard and the Wireless Power Consortium standard, the Qi Standard. Under the Wireless Power Consortium, the Qi specification, a resonant inductive coupling system is utilized to charge a single device at the resonance frequency of the receiver coil circuit. In the Qi standard, the receiving device coil is placed in close proximity with the transmission coil while in the A4WP standard, the receiving device coil is placed near the transmitting coil, potentially along with other receiving coils that belong to other charging devices.

Typically, a wireless power system includes a transmitter coil that is driven by an inverter stage to produce a time-varying magnetic field and a receiver coil, which can be part of a device such as a cell phone, PDA, computer, or other device, that is positioned relative to the transmitter coil to receive the power transmitted in the time-varying magnetic field. However, such a system can produce significant electromotive interference (EMI) due to switching the inverter stages.

Therefore, there is a need to develop better transmission inverter stages for the wireless transmission of power.

SUMMARY

In some embodiments, a threshold calibration system to provide a zero voltage switching signal is presented. The system includes a divider coupled to a switching node; a calibration ramp generator; a reference voltage generator; a comparator; a first multiplexer coupled to receive a divider output signal from the divider and a calibration ramp signal from the calibration ramp generator and provide a signal to the comparator based on a calibration enable signal; a second multiplexer coupled to receive reference voltages from the reference voltage generator, the second multiplexer provided a threshold signal to the comparator; and a digital feedback circuit receiving an output signal from the comparator and providing the zero voltage switching signal.

These and other embodiments are discussed further below with respect to the following figures.

These and other aspects of the present invention are further discussed below.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description illustrates inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Figure 1:
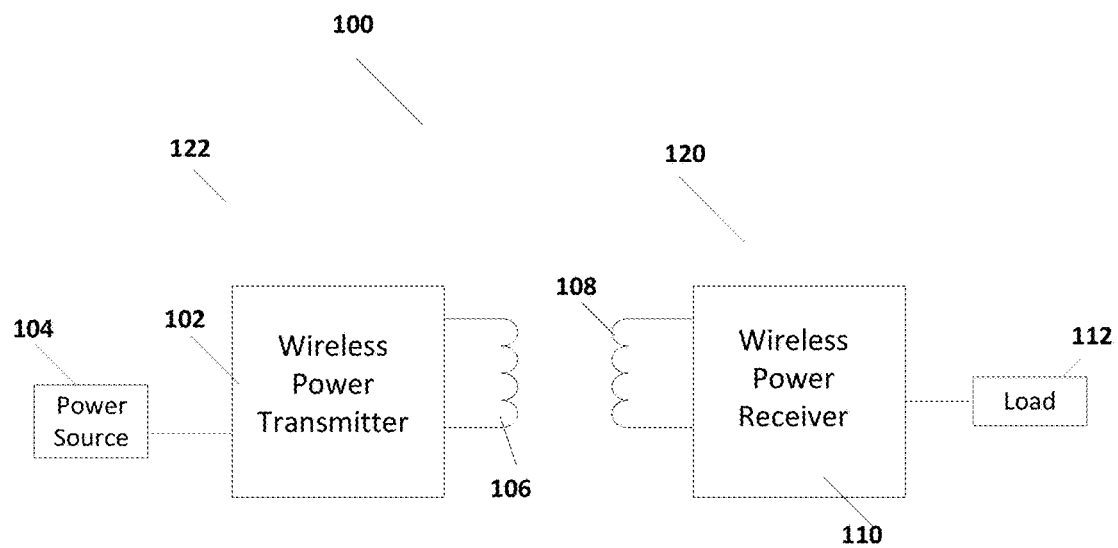
FIG. 1 illustrates a transmission system according to some embodiments.

FIG. 1 illustrates a simplified wireless power system 100 that includes a device 122 with a wireless power transmitter 102 and a second device 120 that includes a wireless power receiver 120. As illustrated in FIG. 1A, a wireless power transmitter 102 is coupled to receive power from a power source 104. Wireless power transmitter 102 drives a transmit coil 106 to produce a time-varying electromagnetic field at a frequency, which may match a resonant frequency of system 100. Receiver coil 108 of wireless power receiver 110 couples with the electromagnetic field generated by transmit coil 106 of wireless power transmitter 102 to receive the wireless power that is transmitted. As illustrated in FIG. 1, receiver coil 108 is coupled to a wireless power receiver 110 which receives power from receiver coil 108 and provides power to a load 112. Wireless power transmitter 102 may be configured to generate a time-varying electromagnetic field in the presence of wireless power receiver 110, which is configured to receive the wireless power transmitted by the wireless power transmitter 102. The elements of the wireless power transmitter 102 and wireless power receiver 110 may vary in size and shape to accommodate power requirements and physical location of wireless power system 100.

Wireless power receiver 110 recovers the power from the time varying electromagnetic field and typically provides DC power input to load 112 of a device that includes wireless power receiver 110 and receive coil 108. Power is transferred when the device is proximate wireless power transmitter 102. In some cases, load 112 may include a battery charger and the device includes a battery.

Figure 2:
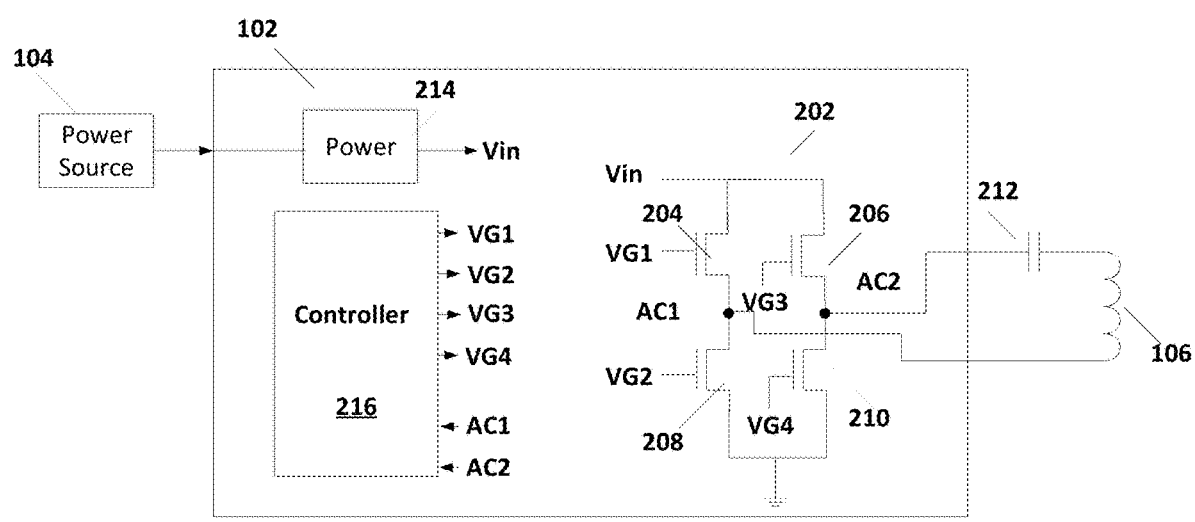
FIG. 2 illustrates a transmitter of the transmission system according to some embodiments.

FIG. 2 illustrates an example of transmitter 102. As illustrated, transmitter 102 is coupled to receive power from power source 104. Power from power source 104 is received in power module 214, which produces voltages used by the internal circuitry of transmitter 102 and a voltage Vin that is provided to power transmit coil 106. As illustrated in FIG. 2, transmit coil 106 is driven by an inverter circuit 202. In FIG. 2, inverter circuit 202 is illustrated as a full-wave inverter that includes transistors 204, 206, 208, and 210. As illustrated, transistors 204 and 208 are coupled in series between the voltage Vin and ground and forms a node AC1 between them. Similarly, transistors 206 and 210 are coupled in series between Vin and ground and forms a node AC2 between them. Transmit coil 106 in parallel with a capacitor 212 is coupled between nodes AC1 and AC2. The gates of transistors 204, 206, 208, and 210 are controlled by voltages VG1, VG2, VG3, and VG4, respectively. As such, inverter circuit 202 switches the voltages between AC1 and AC2 by alternately switching on transistors 204 and 210 and transistors 206 and 208.

However, there is a problem of electromotive interference (EMI) due to zero-voltage crossing of the main inverter stage on switching nodes AC1 and AC2. Conventionally, to mitigate this problem smoothing capacitors are coupled to the nodes. These capacitors are typically placed on the printed circuit board (PCB) along with transmitter circuit 102 (which may be formed on an integrated circuit). However, these smoothing capacitors slow down the switching edges and increases the power dissipation of the circuit.

In accordance with embodiments of the present invention, the switching point of the inverter is calibrated continuously during operation. In particular, transmitter controller 216 calibrates the switching point of inverter circuit 202 by reading the variation over time and enabling a digital calibration loop. Such a calibration loop can be implemented with a state machine that optimizes the switching points.

Figure 3:
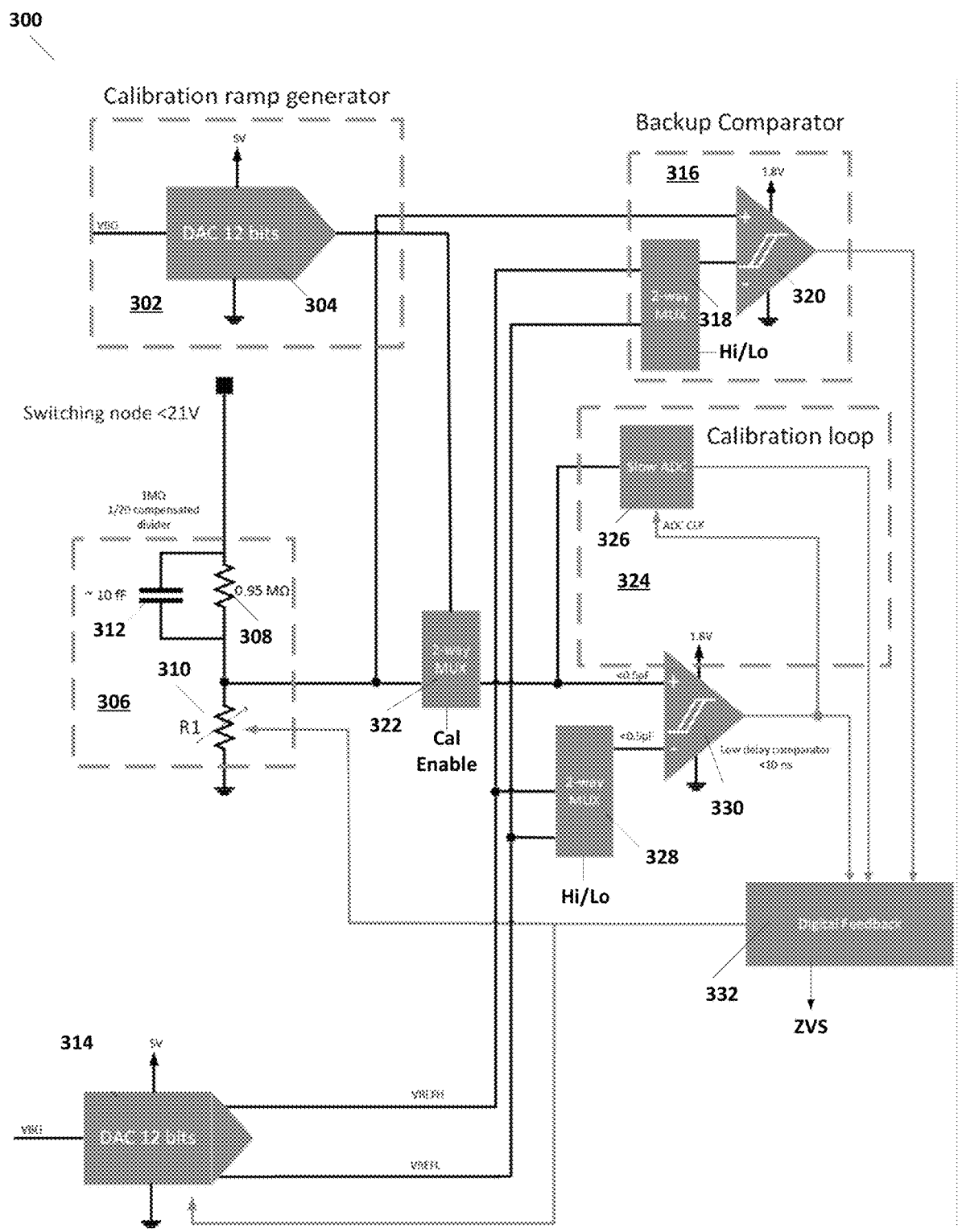
FIG. 3 illustrates a zero-switching circuit according to some embodiments.

FIG. 3 illustrates a calibration circuit 300 according to some embodiments of the present invention. As illustrated in FIG. 3, calibration circuit 300 receives an input from a switching node (AC1 or AC2) and provides a switching voltage ZVS. The switching node input is received in a compensated divider 306. In the example illustrated in FIG. 3, divider 306 includes series coupled resistors 308 and 310, and a capacitor 312. Capacitor 312 can be a fixed capacitor or a capacitor bank that is digitally configurable. Resistor 310 is a variable resistance that is part of the feedback loop of calibration circuit 300. In some embodiments, capacitor 312 can be placed in parallel with fixed resistor 308 to provide compensation in fine adjustments. Compensation serves to damp voltage node variation between resistor 308 and variable resistor 310 due to disturbances induced by switching to which the compensated divider is connected. The node between resistor 308 and variable resistor 310 provides input to a multiplexer 322.

Multiplexer 322 receives input from divider 306 and from a calibration ramp generator 302. Calibration ramp generator 302 includes a digital-to-analog converter (DAC) 304 that receives a band-gap voltage VBG and creates a stepwise ramp output. Multiplexer 322 inputs a calibration enable signal, which selects between the input from divider 306 and ramp generator 302 and outputs the signal from ramp generator 302 when the calibration enable signal is asserted and outputs the signal from divider 306 when the calibration enable signal is not asserted. The output signal from multiplexer 322 is input to calibration loop 324 and to comparator 330.

Comparator 330 receives the output signal from multiplexer 322 and an output signal from multiplexer 328. Multiplexer 328 receives as inputs references voltage VREFH and VREFL from a DAC 314. DAC 314 may be similarly constructed as DAC 304 of calibration ramp generator 302. Multiplexer 328 selects between the reference signals VREFH and VREFL according to the Hi/Lo input signal. The Hi/Lo signal indicates whether the high-side transistor or the lo-side transistor associated with the node input to voltage divider 306 is active. The output signal from comparator 330 is input to calibration loop 324 and to digital feedback 332.

Calibration loop 324 includes a slow analog-to-digital converter (ADC) 326, receives and digitizes the output signal from multiplexer 322. Calibration loop 324 is clocked by the output signal from comparator 330. The "slow" features in this context refers to the fact that ADC provides a better reading accuracy than that the DACs may produce. ADC 326 may have a long settling time being to the conversion end decided by the triggering of comparator 330 during the calibration cycle.

In some embodiments, a backup comparator 316 can receive the output signal from divider 306 and the reference voltages VREFL and VREFH from DAC 314 and provides a comparator signal to digital feedback 332. As illustrated in FIG. 3, backup comparator includes a multiplexer that receives the voltages VREFL and VREFH and provides a signal (one of VREFL or VREFH) to a comparator 320 according to the Hi/Lo input signal. Comparator 320 receives the output signal from divider 306 along with the output signal from multiplexer 318 and provides a comparison signal to digital feedback 332.

Digital feedback 332 receives the output signal from comparator 330, calibration loop 324, and backup comparator 316. Digital feedback 332 then provides a signal to DAC 314 that controls the values of VREFL and VREFH. Digital feedback 332 also provides a signal to variable resistor 310, which sets the value of resistor 310. Digital feedback 332 also provides a ZVS signal to the remainder of controller 216 that controls the switching of inverter circuit 202.

In some embodiments, digital feedback 332 can operates in two modes: a calibration mode (alternatively referred to as the calibration cycle) and a normal mode. The calibration mode may be activated periodically or by a triggering event raised by other subsystems in which the proposed system is inserted. For example, the triggering event may include, but is not limited to, a temperature variation or a power variation. The goal of the calibration cycle of digital feedback 332 is to suppress offset in the main comparator 330 caused by process variation, temperature, and aging. During the calibrating mode, through the 2-way MUXes 318, 322 and 328, the Backup Comparator 316 is fed by the last DAC 314 configuration, which stores the last calibration, and is used as the effective output of ZVS allowing no time interruption to normal operation. During calibration cycle the main comparator 330 is instead fed by both DACs, the calibration ramp producing DAC 304 and last configuration storing DAC 314 with the target to identify the current input offset for the main comparator 330 as illustrated in FIG. 5.

Figure 4:
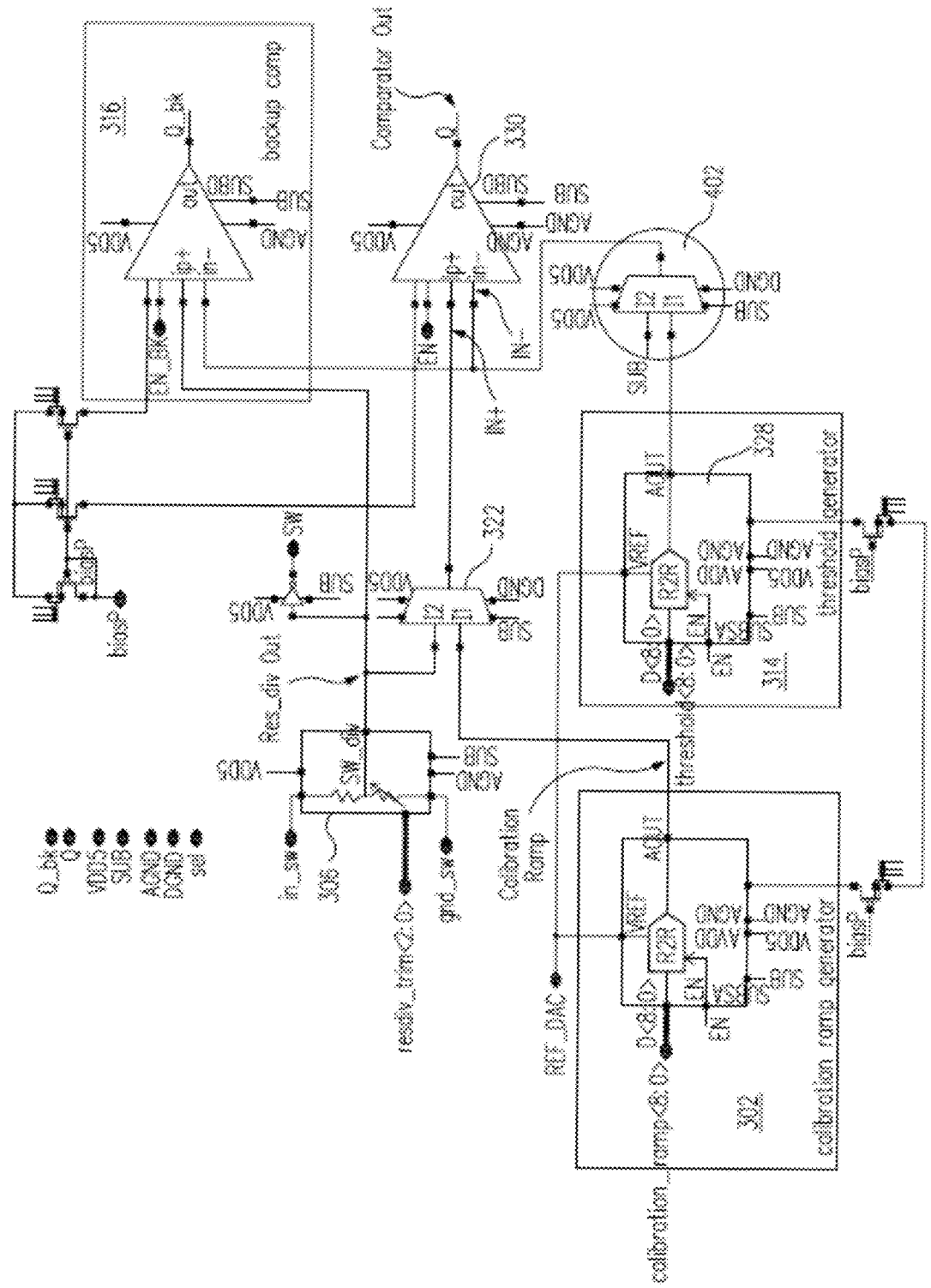
FIG. 4 illustrates a layout of the circuit illustrated in FIG. 3.

FIG. 4 illustrates a board layout of part of circuit 300 illustrated in FIG. 3. In particular, FIG. 4 shows divider 306, calibration ramp generator 302, multiplexer 322, multiplexer 328, threshold generator 314, and backup comparator 316. The calibration ramp signal, the divider output signal, the inputs to comparator 330, and the comparator output signal is specifically illustrated.

Figure 5:
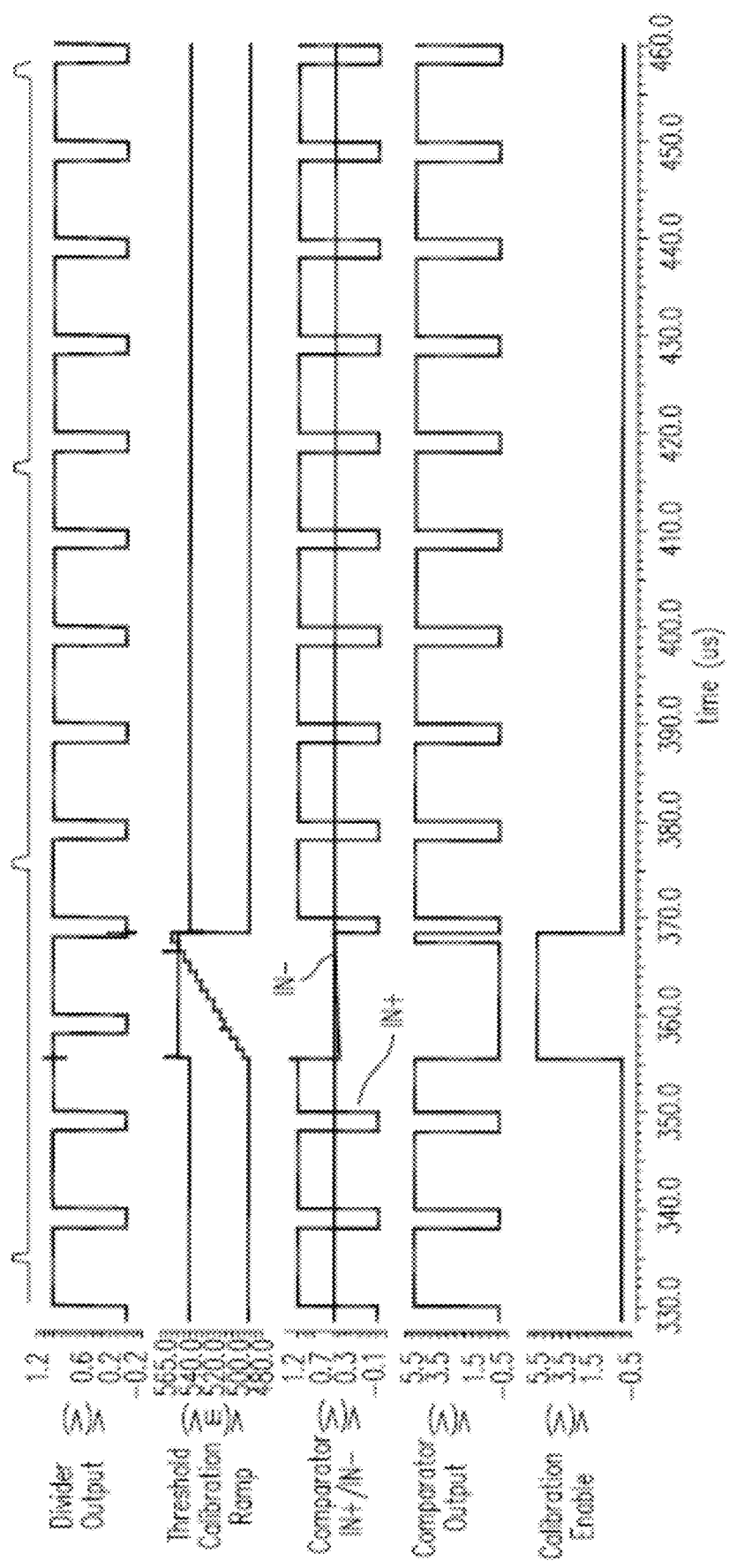
FIG. 5 illustrates a timing diagram for a particular circuit.

FIG. 5 illustrates a timing diagram illustrates signal values of various signals illustrated in FIGS. 3 and 4. The top trace is the divider output signal from divider 306. The threshold signal illustrates the signal from multiplexer 402, which receives the output signal from multiplexer 328. The calibration ramp signal indicates the output signal from calibration ramp generator 302. The comparator In+/IN− pair of signals indicates the signals from multiplexer 322 (IN+) and the signals from multiplexer 328 (IN−). The comparator output signal indicates the output signal from comparator 330. The bottom signal illustrates the calibration enable signal. As is illustrated, when the calibration enable signal is asserted, the calibration ramp signal is applied to comparator 330 along with the threshold signal. The comparator output indicates when the calibration ramp signal exceeds the threshold signal. When calibration enable is not asserted, then the comparator receives the divider output in comparison with the threshold signal and the comparator output signal indicates when the divider output signal is higher than the threshold signal. However, without an offset the threshold is not updated after the calibration is complete.

Figure 6:
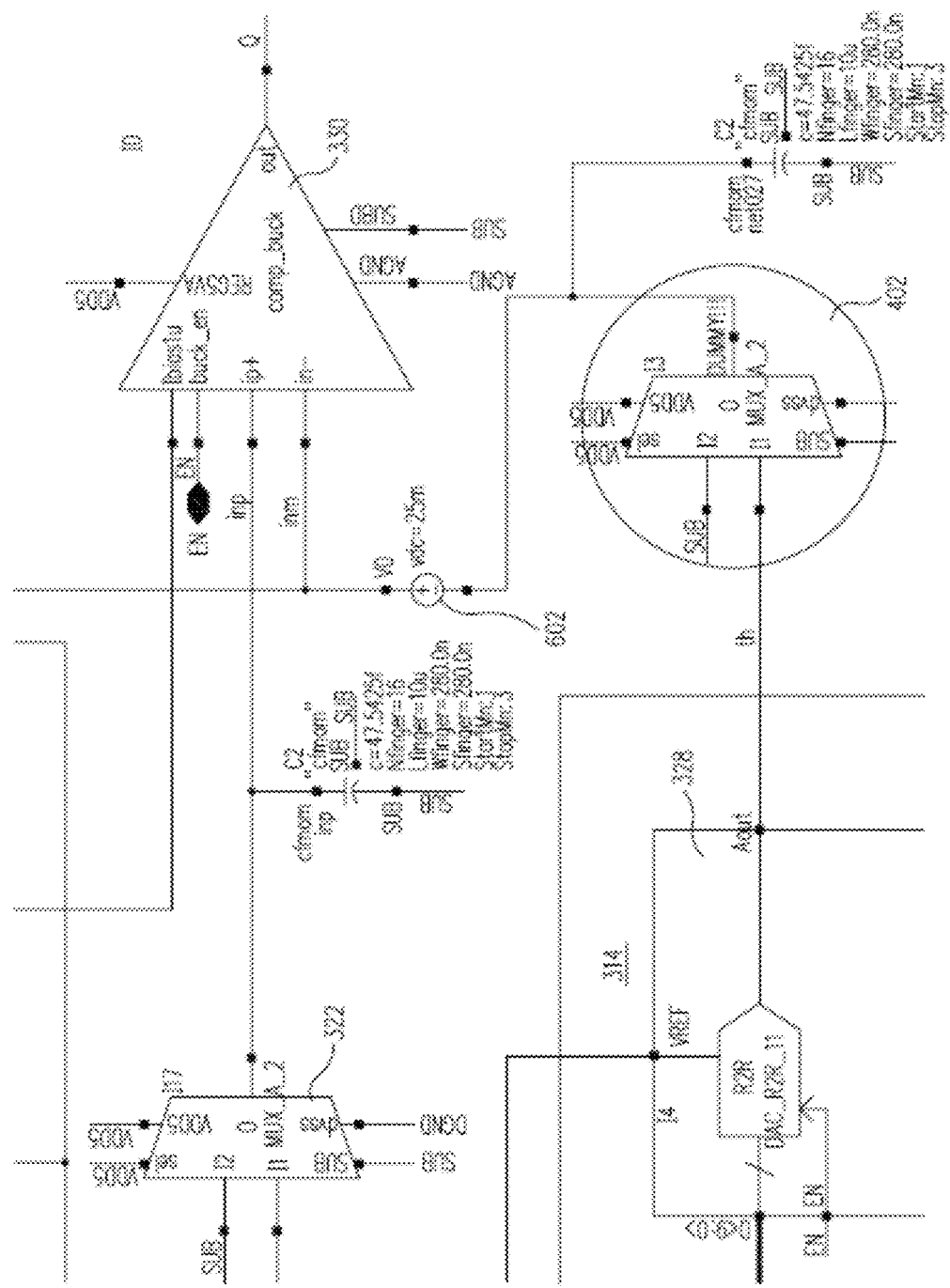
FIG. 6 illustrates another layout of the circuit illustrated in FIG. 3.
Figure 7:
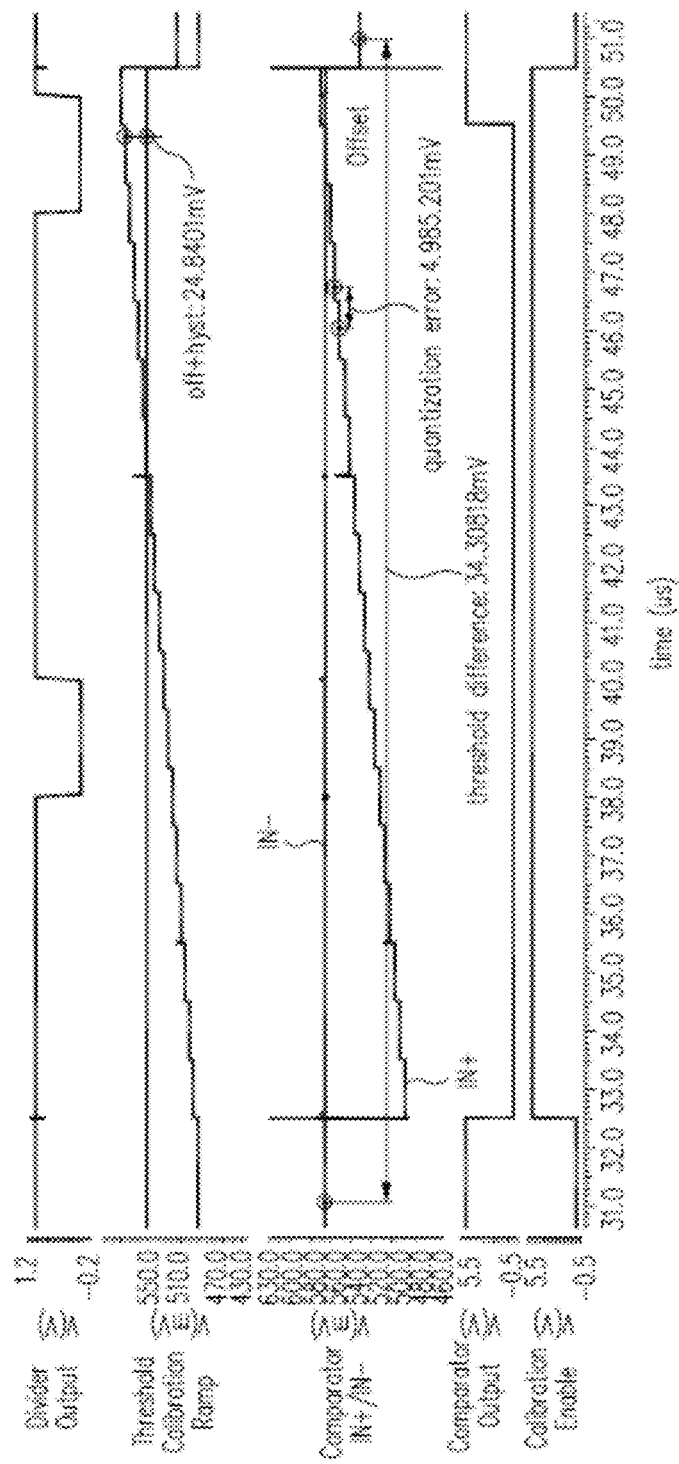
FIG. 7 illustrates a timing diagram for the circuit illustrated in FIG. 6.

FIG. 6 illustrates an embodiments layout with an offset 602 which can set an offset value. As is illustrated in FIG. 6, an offset 602 is provided between multiplexer 402 and the negative input IN− of comparator 330. Offset 602 can be set to calibrate the threshold voltage during the calibration phase. FIG. 7 illustrates operation with offset 602, which provides an offset adjustment to the threshold voltage.

The above detailed description is provided to illustrate specific embodiments of the present invention and is not intended to be limiting. Numerous variations and modifications within the scope of the present invention are possible. The present invention is set forth in the following claims.

What is claimed is:

1. A threshold calibration system to provide a zero voltage switching signal, comprising:
   a divider coupled to a switching node;
   a calibration ramp generator;
   a reference voltage generator;
   a comparator;
   a first multiplexer coupled to receive a divider output signal from the divider and a calibration ramp signal from the calibration ramp generator and provide a signal to the comparator based on a calibration enable signal;
   a second multiplexer coupled to receive reference voltages from the reference voltage generator, the second multiplexer providing a threshold signal to the comparator; and
   a digital feedback circuit receiving an output signal from the comparator and providing the zero voltage switching signal,
   wherein the digital feedback circuit provides an offset to the divider based on the calibration ramp signal and the reference voltages.

2. The threshold calibration system of claim 1, wherein calibration may be continuous.

3. The threshold calibration system of claim 1, wherein calibration may be periodic.

4. The threshold calibration system of claim 3, wherein calibration may be triggered by an event.

5. The threshold calibration of claim 4, wherein the event may be initiated by die temperature.

6. The threshold calibration of claim 4, wherein the event may be initiated by load power variations.

7. A threshold calibration system to provide a zero voltage switching signal, comprising:
   a divider coupled to a switching node;
   a calibration ramp generator;
   a reference voltage generator;
   a comparator;
   a first multiplexer coupled to receive a divider output signal from the divider and a calibration ramp signal from the calibration ramp generator and provide a signal to the comparator based on a calibration enable signal;
   a second multiplexer coupled to receive reference voltages from the reference voltage generator, the second multiplexer providing a threshold signal to the comparator;
   a digital feedback circuit receiving an output signal from the comparator and providing the zero voltage switching signal; and
   a backup comparator coupled to the second multiplexer and the divider, the backup comparator providing for uninterrupted operation during a calibration cycle.

* * * * *